United States Patent
Park et al.

(10) Patent No.: US 7,673,203 B2
(45) Date of Patent: Mar. 2, 2010

(54) INTERCONNECT DELAY FAULT TEST CONTROLLER AND TEST APPARATUS USING THE SAME

(75) Inventors: Chang Won Park, Kyunggi-do (KR); Ki Man Jeon, Kyunggi-do (KR); Young Hwan Kim, Kyunggi-do (KR); Jae Gi Son, Kyunggi-do (KR); Hyun Bean Yi, Kyunggi-do (KR); Sung Ju Park, Kyunggi-do (KR)

(73) Assignee: Korea Electronics Technology Institute, Sungnam-si (KR)

( * ) Notice: Subject to any disclaimer, the term of this patent is extended or adjusted under 35 U.S.C. 154(b) by 485 days.

(21) Appl. No.: 11/616,471

(22) Filed: Dec. 27, 2006

(65) Prior Publication Data
US 2007/0157058 A1    Jul. 5, 2007

(30) Foreign Application Priority Data
Dec. 29, 2005  (KR) .................... 10-2005-0133448

(51) Int. Cl.
*G01R 31/28*   (2006.01)
(52) U.S. Cl. ........................... 714/726; 714/731
(58) Field of Classification Search .......... 714/726–731
See application file for complete search history.

(56) References Cited

U.S. PATENT DOCUMENTS

| | | | |
|---|---|---|---|
| 6,000,051 A * | 12/1999 | Nadeau-Dostie et al. | 714/727 |
| 6,286,119 B1 * | 9/2001 | Wu et al. | 714/726 |
| 7,073,111 B2 * | 7/2006 | Whetsel | 714/727 |
| 7,409,611 B2 * | 8/2008 | Whetsel | 714/726 |
| 7,437,636 B2 * | 10/2008 | Rajski et al. | 714/726 |
| 7,487,419 B2 * | 2/2009 | Mukherjee et al. | 714/729 |

* cited by examiner

*Primary Examiner*—Kevin L Ellis
*Assistant Examiner*—Steve Nguyen
(74) *Attorney, Agent, or Firm*—Sughrue Mion, PLLC

(57) ABSTRACT

An interconnect delay fault test controller and a test apparatus using the same wherein an update operation and a capture operation may be carried out in one interval of a system clock or a core clock when carrying out an interconnect delay fault test between an IEEE P1500 wrapped cores in a SoC as well as an interconnect wire on a board based on an IEEE 1149.1, and wherein the interconnect delay fault test using different system clocks or core clocks may be carried out simultaneously in one test cycle corresponding to each system clock or core clock even when multiple system clocks or core clocks exists is disclosed.

12 Claims, 6 Drawing Sheets

INTERCONNECT DELAY FAULT TEST CONTROLLER AND TEST APPARATUS USING THE SAME

RELATED APPLICATIONS

The present disclosure relates to subject matter contained in priority Korean Application No. 10-2005-0133448, filed on 29 Dec. 2005 which is herein expressly incorporated by reference in its entirety.

BACKGROUND OF THE INVENTION

1. Field of the Invention

The present invention relates to an interconnect delay fault test controller and a test apparatus using the same, and in particular, to an interconnect delay fault test controller and a test apparatus using the same wherein an update operation and a capture operation may be carried out in one interval of a system clock or a core clock when carrying out an interconnect delay fault test between an IEEE P1500 wrapped cores in a SoC as well as an interconnect wire on a board based on an IEEE 1149.1, and wherein the interconnect delay fault test using different system clocks or core clocks may be carried out simultaneously in one test cycle corresponding to each system clock or core clock even when multiple system clocks or core clocks exists.

2. Description of Prior Art

A board level test checks a fault in a chip mounted on a board and a fault in an interconnect wire between the chips. The test of the board gets more difficult to carry out as a design technique of the board progresses. In order to facilitate the test, an IEEE 1149.1 standard was established. A detail of the IEEE 1149.1 standard may be referenced from IEEE standard (IEEE Standard 1149.1-2001, "IEEE Standard Test Access Port and Boundary-Scan Architecture," IEEE, June 2001).

In addition, in design of a SoC, even when the design of the SoC enables a complex system design by integrating perfectly developed cores, an integration of test between internal cores requires a lot of time and effort. In order to enable a reuse of the test as well as the design, a standard for testing the internal cores referred to as an IEEE P1500 in an aspect of a test integration has been announced. IEEE P1500 is a preliminary version of the standard for the test of the internal cores. IEEE P1500 working group proposes core test description language, a core wrapper, various TAMs (Test Access Mechanisms) in the IEEE P1500.

FIG. 1 is a timing diagram illustrating an IEEE 1149.1 boundary scan using the IEEE 1149.1 boundary scan to test a interconnect delay fault in accordance with a conventional art.

A TAP (Test Access Port) comprises a TCK (Test Clock), a TMS (Test Mode), a TDI (Test Data Input; not shown) and a TDO (Test Data Output; not shown), and may further comprise a TRST (Test Reset; not shown) port. The TCK is a clock used when the test is carried out, and the TMS is a signal for controlling a state transition of the TAP controller.

The IEEE 1149.1 specification requires two data registers including a boundary-scan register and a bypass register, and may optionally comprises a device identification register and a user-defined data register.

During a scan operation of the data register, an addressed scan register receives a data register shift enable signal ShiftDR and a data register clock signal ClockDR. In addition, a data register update signal UpdateDR updates a shadow latch.

A detailed description of the test is disclosed in the IEEE 1149.1 specification.

FIG. 1 illustrates the timing diagram of TCK, MS, ClockDR, ShiftDR and UpdateDR of the above-described signals.

The drawback of the conventional art is that a unique problem of the TAP controller wherein an update operation in an output sell and a capture operation in an input cell of the interconnect wire during the test of the interconnect delay fault using the conventional IEEE 1149.1 boundary scan takes 2.5 TCK prevents an efficient test of the interconnect delay fault.

In order to solve the problem of the conventional art, various technologies have been disclosed.

For instance, a paper by K. Lofstrom, titled "Early Capture for Boundary Scan Timing Measurements", Proceedings of IEEE International Test Conference, pp. 417-422, 1996 discloses a method wherein an early latch is added to an input terminal of the boundary cell. That is, the TAP controller is maintained at a state of UpdateDR using the TCK and TMS, a signal EarlyCaptureClock is applied to the latch at a timing to be captured after a rising edge of the UpdateDR signal being outputted by the TAP controller. In this case, the delay fault test is possible by adjusting a time gap for applying the signal EarlyCaptureClock. However, despite the simple scheme, a method for generating the signal EarlyCaptureClock is not disclosed in detail. Moreover, a measurement of an accurate area overhead is difficult, and a design modification of the boundary cell is required when the method is employed.

A paper by J. Shin, H. Kim and S. Kang, titled "At-Speed Boundary Scan Interconnect Testing in a Board with Multiple System Clocks", Design, Automation and Test in Europe Conf., pp. 473-477, 1999 disclose a method wherein an ECCR (Early Capture Control Register) generates the signal EarlyCaptureClock for the interconnect using different clocks by adding the ECCR to the method disclosed by Lofstrom to be able to test a board employing multiple system clock.

Contrary to Lofstrom, a paper by Y. Wu and P. Soong, titled "Interconnect Delay Fault Testing with IEEE 1149.1", Proceedings of IEEE International Test Conference, pp. 449-457, September 1999 discloses two methods wherein a programmable delay circuit similar to the ECCR disclosed by Shin is employed instead of extending the state of UpdateDR using the TCK and the TMS. The two methods include early capturing in the UpdateDR state in the input cell and late updating in the CaptureDR state in the output cell. A ClockDR signal for the early capture signal or an UpdateDR signal for the late update are applied after a desired time gap from the programmable delay circuit. While the paper by Wu discloses a signal generating circuit and a waveform in detail, a structure is complex and the area overhead requires an optimization.

A paper by S. Park and T. Kim, titled "A New IEEE 1149.1 Boundary Scan Design for The Detection of Delay Defects", Design, Automation and Test in Europe Conference, pp. 458-462, 2000 discloses a method wherein UpdateDR is applied trailing by 1.5 TCK by temporarily replacing the system clock with the TCK to transit a state of the TAP controller. In accordance with the method by Park, while one system clock cycle is lapsed from the UpdateDR signal to the ClockDR signal, a generation and a synchronization of a TMS pattern according to a frequency of the system clock are difficult. Accordingly, the method by Park is not completely compatible to the IEEE 1149.1.

FIG. 2 is a diagram illustrating an IEEE P1500 and a WSP (wrapper serial port) in accordance with a conventional art.

A TAM provides an electrical access of I/O port in an I/O of a system chip, denoted as TAM-In and TAM-out.

A WBC (Wrapper Boundary Cell) is a wrapper boundary cell. A detailed description of a WSI (Wrapper Serial Input), a WSO (Wrapper Serial Output), a WSC (Wrapper Serial Control) and a WIR (Wrapper Instruction Register) may be referred from related standard. The WSC includes a WRCK (wrapper clock), a WRSTN (Wrapper Reset Low), a SelectWIR, a CaptureWR, a ShiftWR and an UpdateWR.

A detailed description of the IEEE P1500 wrapper and the WSP may be referred from the related standards.

In case of the test using IEEE P1500, the update operation in the output WBC and the capture operation in the input WBC of the interconnect wiring are also delayed.

SUMMARY OF THE INVENTION

It is an object of the present invention to provide an interconnect delay fault test controller and a test apparatus using the same wherein an update operation and a capture operation may be carried out in one interval of a system clock or a core clock when carrying out an interconnect delay fault test between an IEEE P1500 wrapped cores in a SoC as well as an interconnect wire on a board based on an IEEE 1149.1, and wherein the interconnect delay fault test using different system clocks or core clocks may be carried out simultaneously in one test cycle corresponding to each system clock or core clock even when multiple system clocks or core clocks exists.

It is an object of the present invention to provide an interconnect delay fault test apparatus using the interconnect delay fault test controller.

In order to achieve the above-described object, there is provided an interconnect delay fault test controller generating a control signal for testing an interconnect delay fault between a boundary scan cell using an IEEE 1149.1 specification, wherein an update signal and a capture signal are generated to carry out an update and a capture based on a system clock signal within one interval of the system clock signal in the boundary scan cell by receiving a data register shift signal, a data register update signal and a data register clock signal of the IEEE 1149.1 specification.

In order to achieve the above-described object, there is also provided an interconnect delay fault test controller generating a control signal for testing an interconnect delay fault between a wrapper boundary cell using an IEEE P1500 specification, wherein an update signal and a capture signal are generated to carry out an update and a capture based on a core clock signal within one interval of the core clock signal in the wrapper boundary cell by receiving a data register shift signal, a data register update signal and a data register capture signal.

In order to achieve the above-described object, there is also provided a test apparatus for testing an interconnect delay fault between a wrapper boundary cell using an IEEE P1500 specification; the apparatus comprising: a first interface circuit carrying out a conversion of n signal between a test access port controller of an IEEE 1149.1 specification and a wrapper serial port of the IEEE P1500 specification, a second interface circuit carrying out an conversion of a signal between the wrapper serial port and the wrapper boundary cell; and a interconnect delay fault test controller in accordance with the present invention.

DETAILED DESCRIPTION OF THE INVENTION

The above-described objects and other objects and characteristics and advantages of the present invention will now be described in detail with reference to the accompanied drawings.

Figure 1:
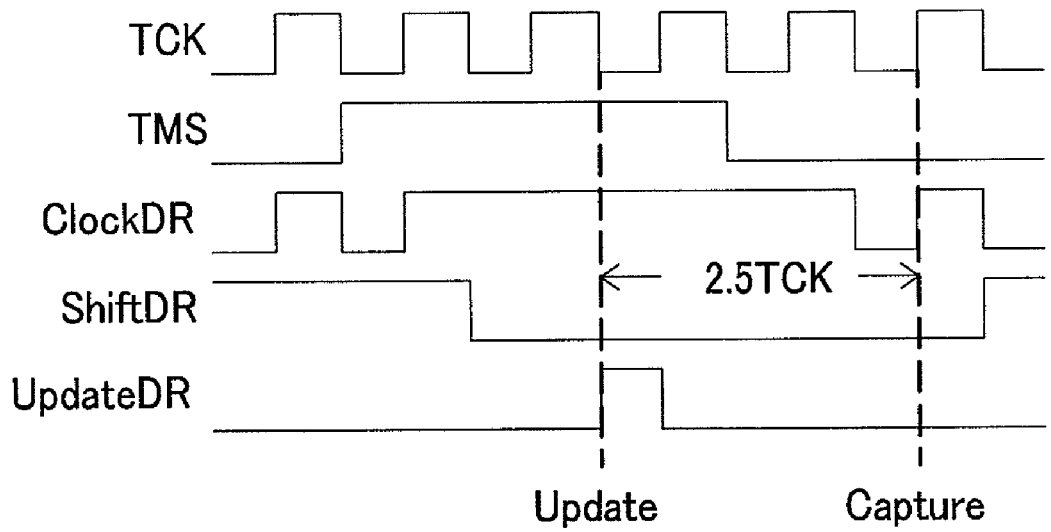
FIG. 1 is a timing diagram illustrating an IEEE 1149.1 boundary scan in accordance with a conventional art.
Figure 2:
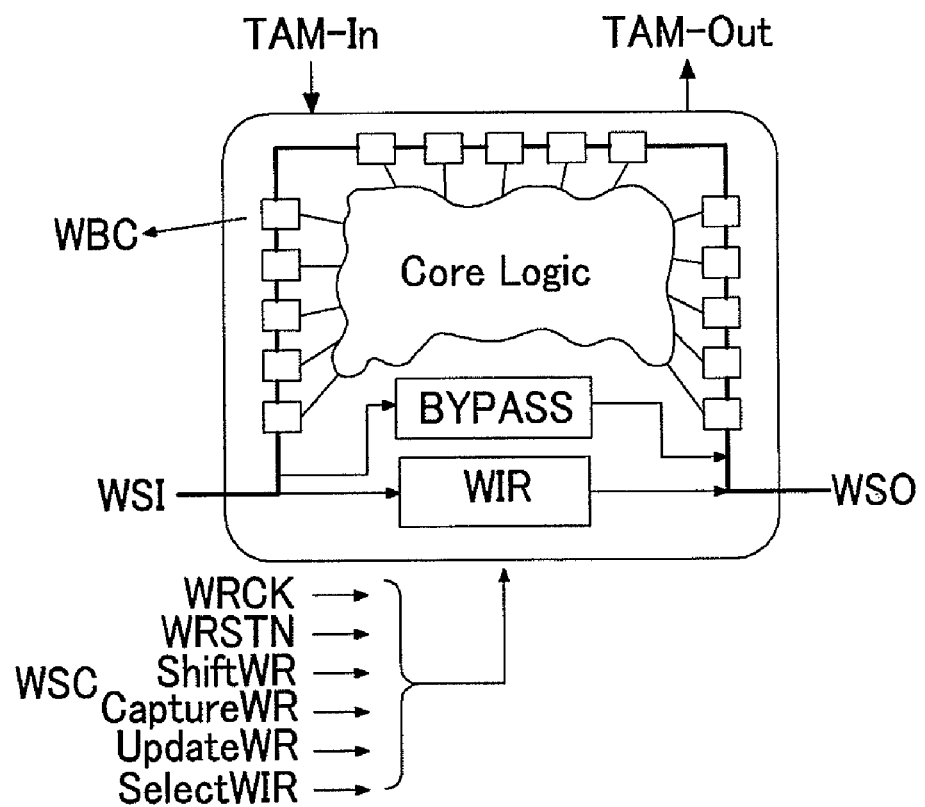
FIG. 2 is a diagram illustrating an IEEE P1500 and a WSP (wrapper serial port) in accordance with a conventional art.
Figure 3:
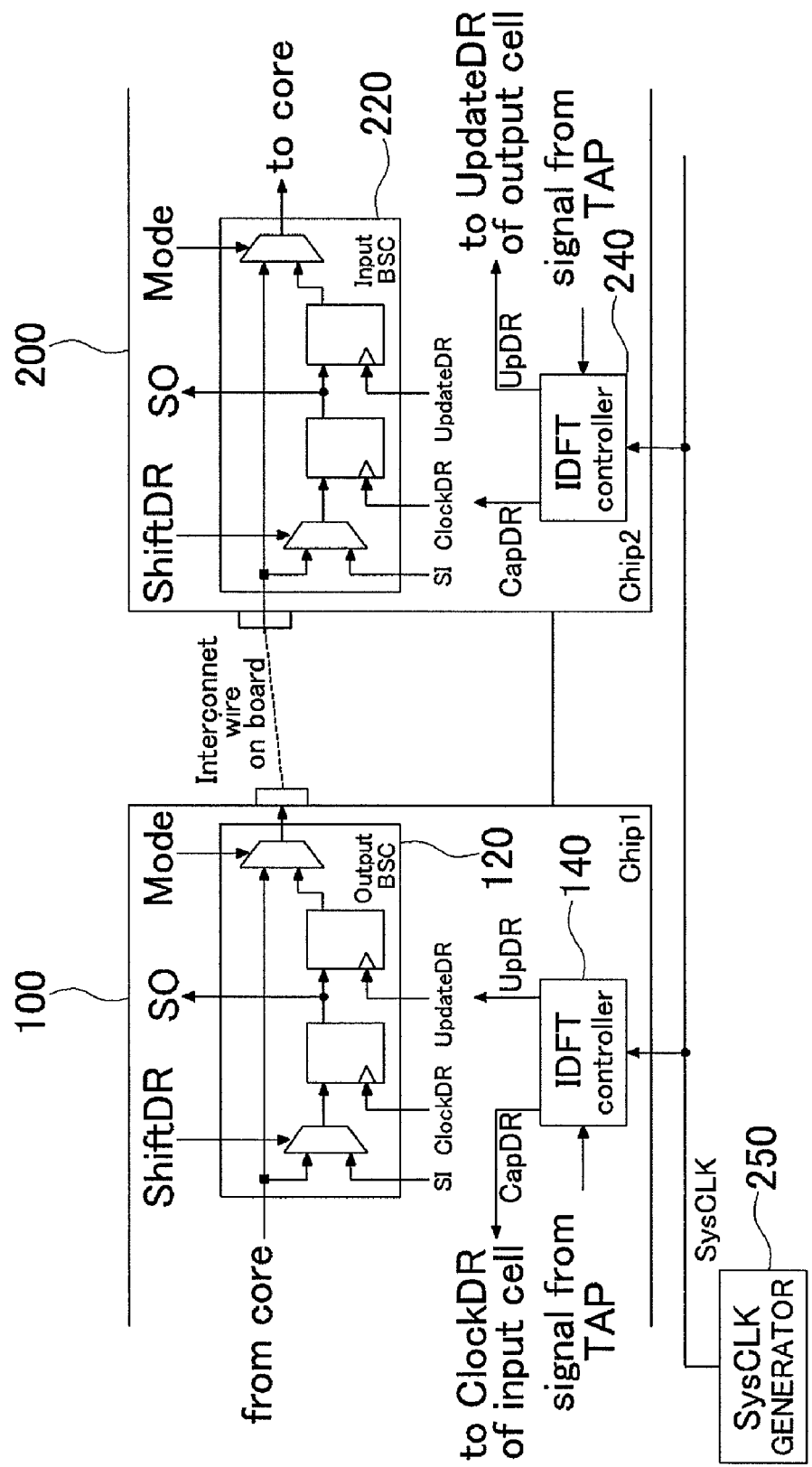
FIG. 3 is a diagram illustrating an interconnect delay fault test environment using an interconnect delay fault test controller in accordance with the present invention.

FIG. 3 is a diagram illustrating an interconnect delay fault test environment using an interconnect delay fault test controller in accordance with the present invention.

A first chip 100 and a second chip 200 operate by a same system clock signal SysCLK, generated by a SysCLK generator 250 and signal generators (UpdateDR Generator, ClockDR Generator; not shown) operating according to the system clock signal is disposed between TAPs (tap1 and tap2 corresponding to the chips; not shown), and an output cell 120 and an input cell 220. In a normal mode, a data register update signal UpdateDR and a data register clock signal ClockDR compliant to an IEEE 1149.1 specification are inputted to the output cell 120 and the input cell 220. In an IDFT mode, an update signal UPDR and a capture signal CapDR generated in interconnect delay fault test controllers 140 and 240 are inputted to the output cell 120 and the input cell 220.

Figure 4:
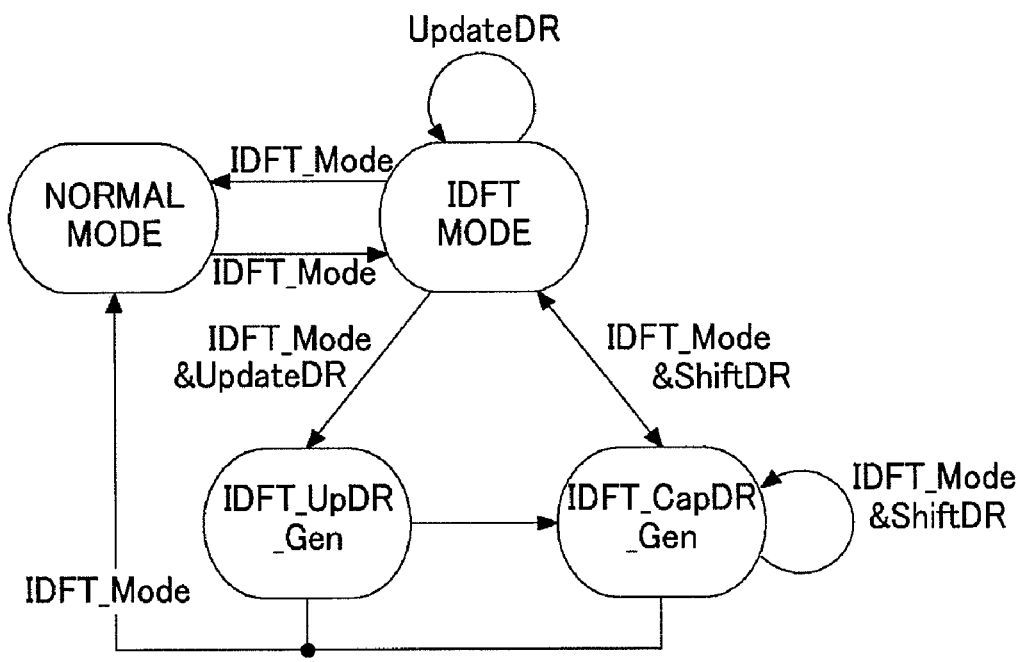
FIG. 4 is a state diagram illustrating an interconnect delay fault test controller in accordance with the present invention.

FIG. 4 is a state diagram illustrating an interconnect delay fault test controller in accordance with the present invention.

As shown, the controller makes a transition among a NORMAL MODE state, an IDFT MODE, an IDFT_UpDR_Gen state and an IDFT_CapDR_Gen state.

Signals ShiftDR and UpdateDR denote a data register shift signal ShiftDR and the data register update signal UpdateDR compliant to an IEEE 1149.1 specification, respectively. A signal IDFT_Mode denotes an IDFT control mode signal wherein IDFT_Mode indicates the normal mode and an IDFT control mode in accordance with the present invention by having a logic value of '0' and '1' respectively.

In the normal mode, the normal mode is changed to the IDFT control mode when a logic value of the IDFT control mode signal IDFT_Mode is '1'. In the IDFT mode, the IDFT mode is maintained when a logic value of the data register update signal UpdateDR is not '1', and the IDFT mode is changed to the IDFT_UpDR_Gen state when the logic value of the IDFT control mode signal IDFT_Mode is '1' and the logic value of the signal UpdateDR is '1'. Thereafter, when the logic value of the IDFT control mode signal IDFT_Mode is '1' and a logic value of the data register shift signal ShiftDR is not '1' after the mode is changed to the IDFT_CapDR_Gen state, the IDFT_CapDR_Gen state is maintained. When the logic value of the IDFT control mode signal IDFT_Mode is '1' and the logic value of the data register shift signal ShiftDR is '1', the mode is changed to the IDFT mode. Thereafter, when the logic value of the IDFT control mode signal IDFT_Mode is '0', the mode is changed to the normal mode.

Figure 5:
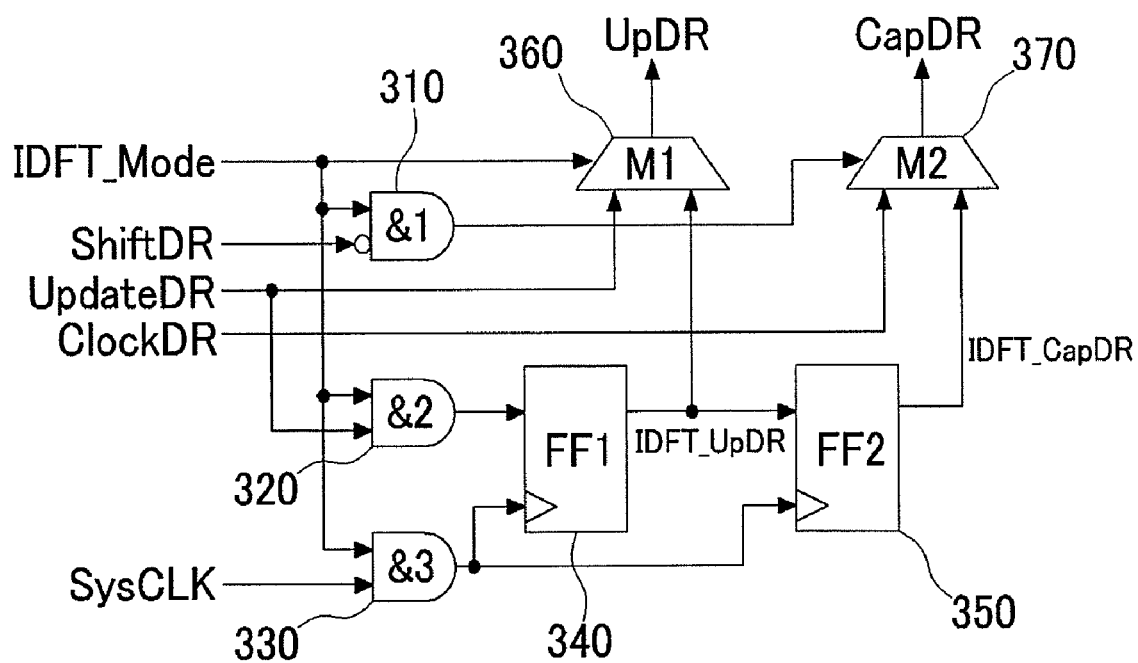
FIG. 5 is a diagram exemplifying an embodiment of an interconnect delay fault test controller in accordance with the present invention.

FIG. 5 is a diagram exemplifying an embodiment of an interconnect delay fault test controller in accordance with the present invention.

Referring to FIG. 5, a first AND logic 310 carries out an AND operation of the IDFT control mode signal IDFT_Mode indicating the normal mode or the IDFT mode and an inverted data register shift signal which is an inverted signal of the data register shift signal ShiftDR.

A second AND logic 320 carries out an AND operation of the IDFT control mode signal IDFT_Mode and the data register update signal UpdateDR.

A third AND logic carries out an AND operation of the IDFT control mode signal IDFT_Mode and the system clock signal SysCLK.

A first flip-flop 340 outputs an IDFT_UpDR signal by carrying out a flip-flop operation of an output signal of the second AND logic 320 using an output signal of the third AND logic as a clock signal.

a second flip-flop 350 outputs an IDFT_CapDR signal by carrying out an flip-flop operation of an output signal of the first flip-flop 340 using an output signal of the third AND logic as the clock signal.

A first multiplexer 360 outputs an update signal UpDR by multiplexing the data register update signal UpdateDR and the IDFT_UPDR signal based on the IDFT control mode signal IDFT_Mode.

A second multiplexer 370 outputs a capture signal CapDR by multiplexing the data register clock signal ClockDR and the IDFT_CapDR signal based on an output signal of first AND logic 310.

For reference, SysCLK denotes the system clock, and IDFT_Mode is a flag defining the normal mode and the IDFT mode by having the logic value of 0 and 1, respectively.

UpdateDR denotes the data register update signal from the TAP controller, and ClockDR denotes the data register clock signal from the TAP controller.

IDFT_UpDR is an internal signal having a rising edge being outputted from the first flip flop synchronized to the system clock signal when in the IDFT mode in accordance with the present invention, i.e. the IDFT control mode signal IDFT_Mode has the logic value of '1'. The IDFT_UpDR signal forces the update signal UPDR to transit from the logic value of '0' to '1' so that an update test result of the boundary scan cell is outputted.

IDFT_CapDR is an internal signal having a rising edge being outputted from the second flip flop synchronized to the system clock signal when in the IDFT mode in accordance with the present invention, i.e. the IDFT control mode signal IDFT_Mode has the logic value of '1'. The IDFT_CapDR signal forces the capture signal CapDR to transit from the logic value of '0' to '1' so that the capture signal CapDR is inputted to the boundary scan cell, thereby capturing a test response.

The update signal UpDR is an output signal of the first multiplexer wherein (update signal UpDR)≦(IDFT_UPDR signal) when the IDFT control mode signal IDFT_Mode has the logic value of '1', and (update signal UpDR)≦(data register update signal UpdateDR) when the IDFT control mode signal IDFT_Mode has the logic value other than '1'.

The capture signal CapDR is an output signal of the second multiplexer wherein (capture signal CapDR)≦(IDFT_CapDR signal) when the IDFT control mode signal IDFT_Mode and the data register update signal UpdateDR have the logic value of '1', and (capture signal CapDR)≦(data register clock signal ClockDR) otherwise.

Figure 6:
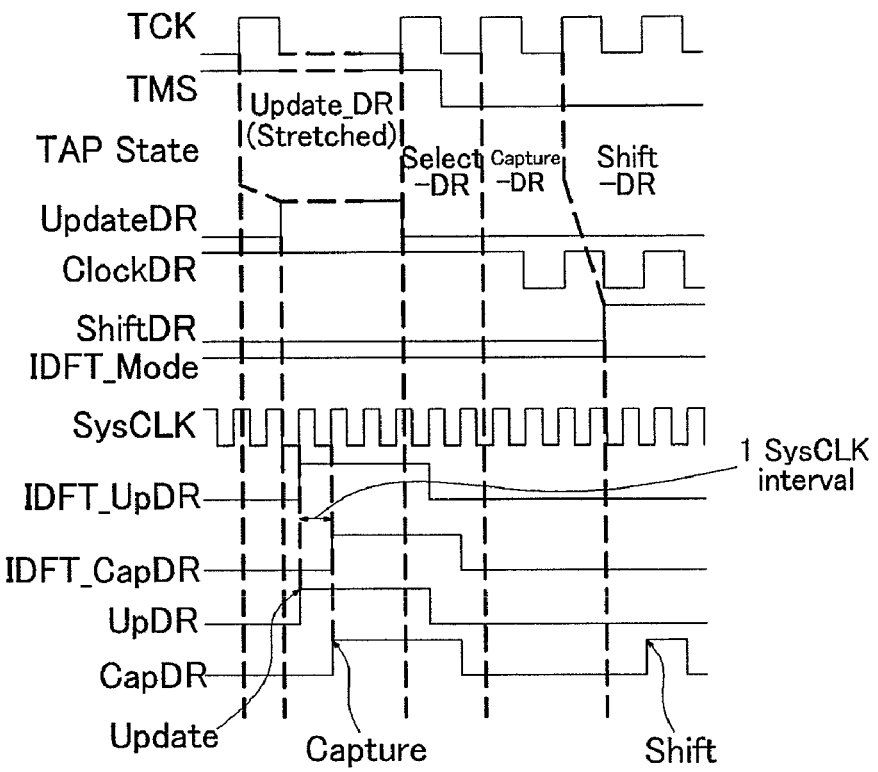
FIG. 6 is a timing diagram of an embodiment of an interconnect delay fault test controller in accordance with the present invention.

FIG. 6 is a timing diagram of an embodiment of an interconnect delay fault test controller in accordance with the present invention.

As shown, the update signal UpDR and the capture signal CapDR are generated in one interval of the system clock SysCLK.

In accordance with a test environment using the interconnect delay fault test controller in accordance with the present invention, the rising edge is sequentially generated in the update signal UpDR and the capture signal CapDR after a test data is loaded to the output cell 120, such that the interconnect delay fault test of an interconnect wire on a board is carried out by the exact one interval of the system clock.

The TAP controller is maintained at an UpdateDR state using the TCK and TMS, and an update operation and a capture operation are generated one per period of the system clock while maintaining the UpdateDR state.

In addition, each delay fault may be tested through the interconnect wire operating at different system clocks by embodying the interconnect delay fault test controller in accordance with the present invention as many as the number of the system clocks used.

Figure 7:
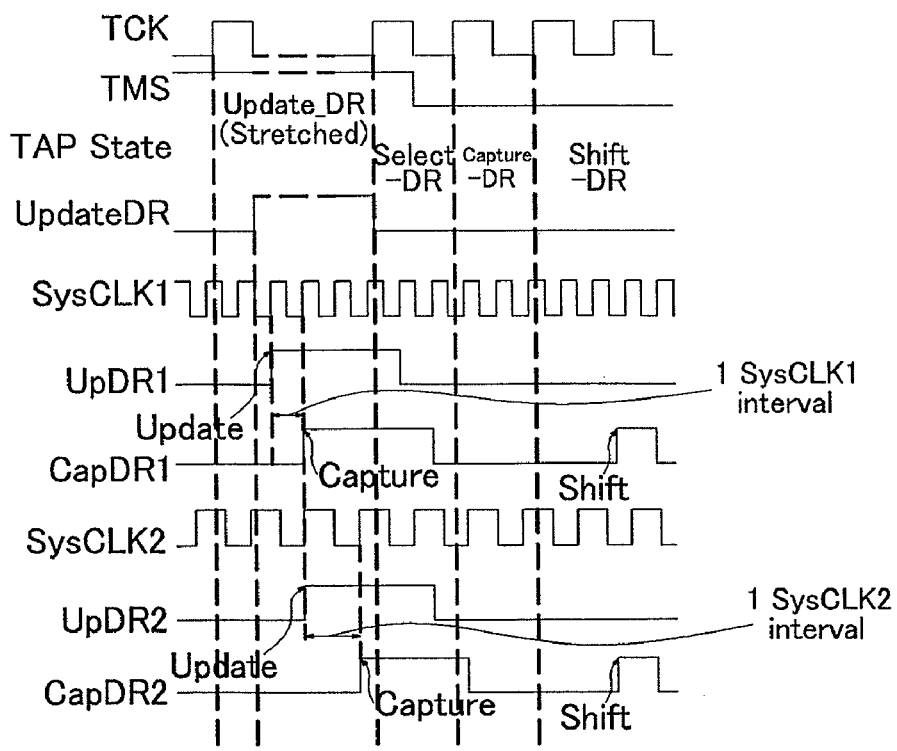
FIG. 7 is a timing diagram illustrating an interconnect delay fault test controller applied in a multiple system clock in accordance with the present invention.

FIG. 7 is a timing diagram illustrating an interconnect delay fault test controller applied in a multiple system clock in accordance with the present invention.

As shown, a first IDFT controller (not shown) generating a fist update signal UpDrl and a first capture signal CapDR1 and a second IDFT controller (not shown) generating a second update signal UpDr2 and a second capture signal CapDR2 for multiple system clock signals including a first system clock signal SysCLK1 and a second system clock signal SysCLK2 are applied. Similar to FIG. 5, the update operation and the capture operation are carried out for one interval of the first system clock SysCLK1. Similarly, the update operation and the capture operation are carried out for one interval of the second system clock SysCLK2.

On the other hand, the interconnect delay fault test controller in accordance with the present invention may be applied to the interconnect wire between cores having IEEE 1500 wrapper as well as between chips.

Figure 8:
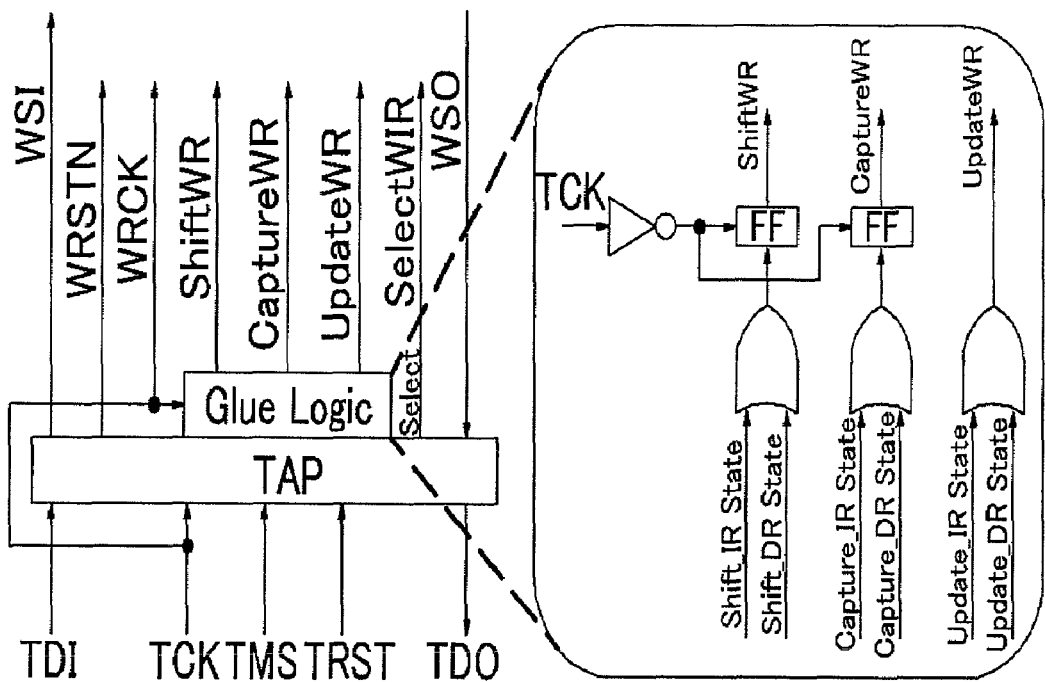
FIG. 8 is a diagram exemplifying an embodiment of TAP to WAP interface logic when an interconnect delay fault test controller is applied to an interconnect between cores in accordance with the present invention.

FIG. 8 is a diagram exemplifying an embodiment of a TAP to WAP interface logic when the interconnect delay fault test controller is applied to the interconnect wire between the cores in accordance with the present invention.

As shown, the TAP to WAP interface logic uses TDI, TCK, TMS, TRST signals of the IEEE 1149.1 specification to interface WRCK, WRSTN, SelectWIR, CaptureWR, ShiftWR, UpdateWR signals of the IEEE P1500 specification.

Figure 9:
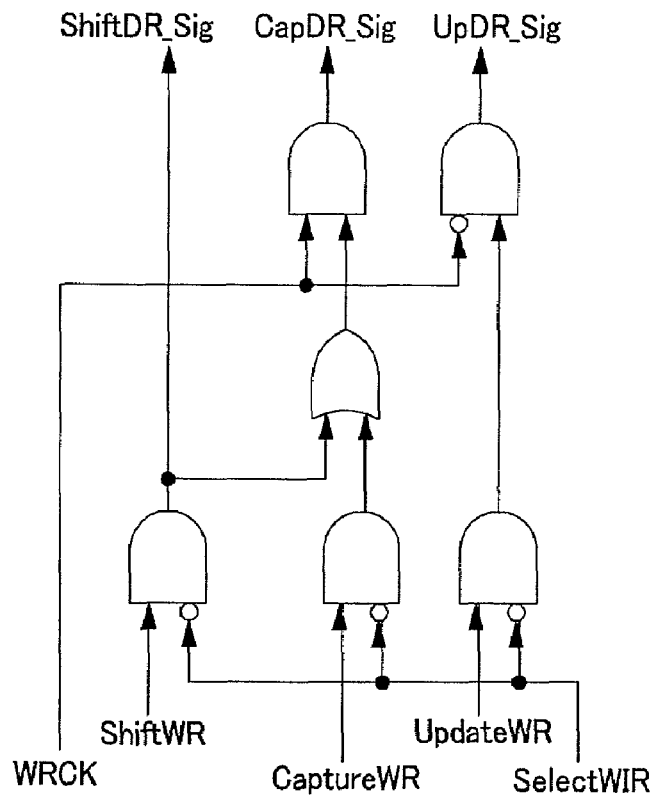
FIG. 9 is a diagram exemplifying an embodiment of WSC to WBC interface logic when an interconnect delay fault test controller is applied to an interconnect between cores in accordance with the present invention.

FIG. 9 is a diagram exemplifying an embodiment of WSC to WBC interface logic when the interconnect delay fault test controller is applied to the interconnect wire between cores in accordance with the present invention.

As shown, the WSC to WBC interface logic uses WRCK, SelectWIR, CaptureWR, ShiftWR, UpdateWR signals of the WSC to interface ShiftDR_Sig, CapDR_Sig, UpDR_Sig signals used in the WBC.

Figure 10:
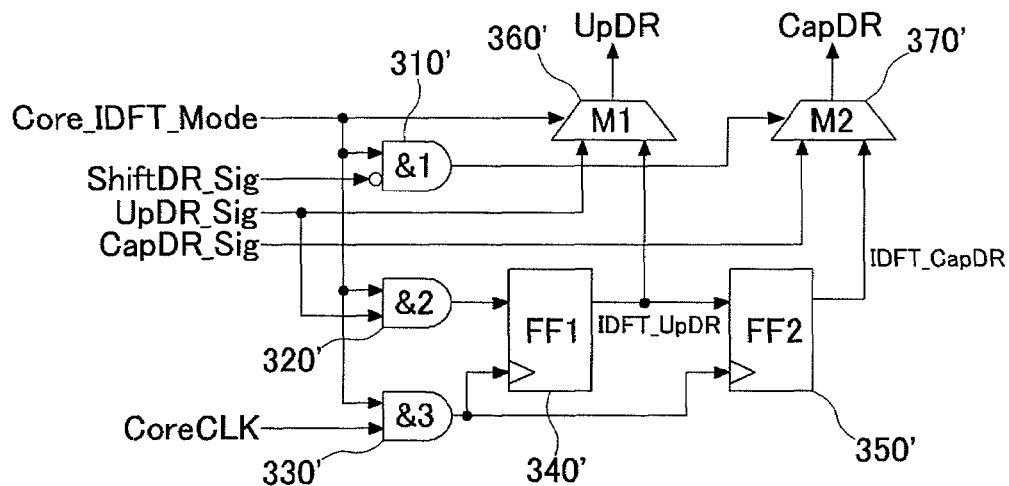
FIG. 10 is a diagram exemplifying an embodiment of an interconnect delay fault test controller to be applied to a WBC of an IEEE P1500 specification in accordance with the present invention.

FIG. 10 is a diagram exemplifying an embodiment of the interconnect delay fault test controller to be applied to the WBC of the IEEE P1500 specification in accordance with the present invention.

The interconnect delay fault test controller of FIG. 10 differs from that of FIG. 5 only in that the controller employs a core IDFT control mode signal Core_IDFT, ShiftDR_Sig, UpDR_Sig, CapDR_Sig, CoreCLK signals. Therefore, a detailed description is omitted.

Figure 11:
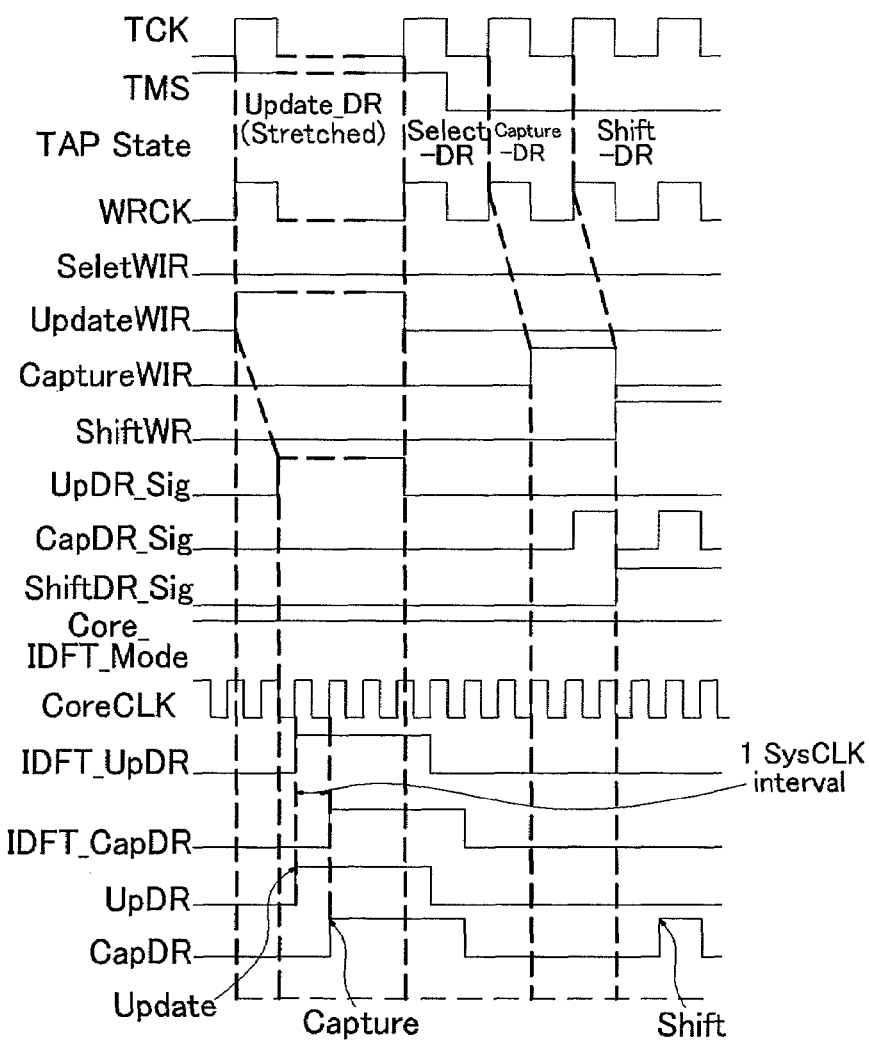
FIG. 11 is a timing diagram of an embodiment of an interconnect delay fault test controller to be applied to a WBC of an IEEE P1500 specification in accordance with the present invention.

FIG. 11 is a timing diagram of an embodiment of the interconnect delay fault test controller to be applied to the WBC of the IEEE P1500 specification in accordance with the present invention.

As shown, the update signal UPDR and the capture signal CapDR are generated in one interval of the core clock Core-CLK.

The present invention provides an interconnect delay fault test apparatus employing the interconnect delay fault test controller described with reference to FIGS. 3 through 11 in accordance with the present invention.

The interconnect delay fault test apparatus tests an interconnect delay fault between the chips including the boundary scan cell using the IEEE 1149.1 specification or a WBC interconnect wire of a SoC (System-on-Chip) core using the IEEE 1500 specification.

While the present invention has been particularly shown and described with reference to the preferred embodiment thereof, it will be understood by those skilled in the art that various changes in form and details may be effected therein without departing from the spirit and scope of the invention as defined by the appended claims.

As described above, the present invention may be configured to carry out the update operation and the capture operation in the one interval of the system clock or the core clock when carrying out the interconnect delay fault test between the IEEE P1500 wrapped cores in the SoC as well as the interconnect wire on the board based on the IEEE 1149.1, and the interconnect delay fault test using different system clocks or core clocks may be carried out in one test cycle corresponding to each system clock or core clock even when multiple system clocks or core clocks exists.

Moreover, the present invention has less area overhead compared to the conventional art, does not require a modification of the boundary cell or the TAP, has a simple test procedure based on IEEE 1149.1, and provides efficient interconnect delay fault test of the board having the multiple clock and the SoC.

What is claimed is:

1. An interconnect delay fault test (IDFT) controller generating a control signal for testing an interconnect delay fault of a boundary scan cell using an IEEE 1149.1 specification, wherein the controller comprises:
    a logic unit that generates the control signal comprising an update signal and a capture signal to carry out an update and a capture based on a system clock signal within one interval of the system clock signal in the boundary scan cell by receiving a data register shift signal, a data register update signal and a data register clock signal of the IEEE 1149.1 specification, and
    wherein the logic unit comprises:
        a first AND logic for carrying out an AND operation of an IDFT control mode signal indicating a normal mode or an IDFT mode, and an inverted data register shift signal;
        a second AND logic for carrying out an AND operation of the IDFT control mode signal and the data register update signal;
        a third AND logic for carrying out an AND operation of the IDFT control mode signal and the system clock signal;
        a first flip-flop for carrying out a flip-flop operation of an output signal of the second AND logic using an output signal of the third AND logic as a clock signal to output an IDFT_UpDR signal;
        a second flip-flop for carrying out a flip-flop operation of an output signal of the first flip-flop using an output signal of the third AND logic as the clock signal to output an IDFT_CapDR signal;
        a first multiplexer for multiplexing the data register update signal and the IDFT_UpDR signal based on the IDFT control mode signal to output the update signal; and
        a second multiplexer for multiplexing the data register clock signal and the IDFT_CapDR signal based on an output signal of first AND logic to output the capture signal.

2. The controller in accordance with claim 1, wherein the update signal and the capture signal are generated such that the update and the capture are carried out within the one interval of the system clock signal while the data register update signal is maintained.

3. The controller in accordance with claim 1, wherein the system clock signal comprises a first system clock signal and a second system clock signal, the update signal comprises first and second update signals, and the capture signal comprises first and second capture signals, corresponding to the first system clock and the second system clock.

4. The controller in accordance with claim 1, wherein a value of the update signal≦a value of the IDFT_UpDR signal is satisfied in the IDFT mode, and the value of the update signal≦a value of the data register update signal is satisfied otherwise.

5. The controller in accordance with claim 1, wherein a value of the capture signal≦a value of the IDFT_CapDR signal is satisfied in the IDFT mode when the data register update signal has a logic value of '1', and the value of the capture signal≦a value of the data register clock signal is satisfied otherwise.

6. A test apparatus for testing an interconnect delay fault between a boundary scan cell using an IEEE 1149.1 specification, the apparatus comprising:
    the controller in accordance with one of claims 1, 2, 3, 4, or 5; and
    a system clock generator that generates the system clock signal.

7. An interconnect delay fault test (IDFT) controller generating a control signal for testing an interconnect delay fault of a wrapper boundary cell using an IEEE P1500 specification,
    wherein the controller comprises:
        a logic unit that generates the control signal comprising an update signal and a capture signal to carry out an update and a capture based on a core clock signal within one interval of the core clock signal in the wrapper boundary cell by receiving a data register shift signal, a data register update signal and a data register capture signal, and wherein the logic unit comprises:
a first AND logic for carrying out an AND operation of a core IDFT control mode signal indicating a normal mode or an IDFT mode and an inverted data register shift signal;
a second AND logic for carrying out an AND operation of the core IDFT control mode signal and the data register update signal;
a third AND logic for carrying out an AND operation of the core IDFT control mode signal and the core clock signal;
a first flip-flop for carrying out a flip-flop operation of an output signal of the second AND logic using an output signal of the third AND logic as a clock signal to output an $IDFT_{13}$ UpDR signal;
a second flip-flop for carrying out a flip-flop operation of an output signal of the first flip-flop using an output signal of the third AND logic as the clock signal to output an IDFT CapDR signal;
a first multiplexer for multiplexing the data register update signal and the IDFT_UpDR signal based on the core IDFT control mode signal to output the update signal; and
a second multiplexer for multiplexing the data register clock signal and the IDFT_CapDR signal based on an output signal of first AND logic to output the capture signal.

8. The controller in accordance with claim 7, wherein the update signal and the capture signal are generated such that the update and the capture are carried out within the one interval of the core clock signal while the data register update signal is maintained.

9. The controller in accordance with claim 7, wherein the core clock signal comprises a first core clock signal and a second core clock signal, the update signal comprises first and second update signals, and the capture signal comprises first and second capture signals, corresponding to the first core clock and the second core clock.

10. The controller in accordance with claim 7, wherein a value of the update signal≦a value of the IDFT_UpDR signal is satisfied in the IDFT mode, and the value of the update signal≦a value of the data register update signal is satisfied otherwise.

11. The controller in accordance with claim 7, wherein a value of the capture signal≦a value of the IDFT_CapDR signal is satisfied in the IDFT mode when the data register update signal has a logic value of '1', and the value of the capture signal≦a value of the data register clock signal is satisfied otherwise.

12. A test apparatus for testing an interconnect delay fault of a wrapper boundary cell using an IEEE P1500 specification, the apparatus comprising:
a first interface circuit carrying out a conversion of a signal between a test access port controller of an IEEE 1149.1 specification and a wrapper serial port of the IEEE P1500 specification;
a second interface circuit carrying out a conversion of a signal between the wrapper serial port and the wrapper boundary cell; and
an interconnect delay fault test controller generating a control signal for testing the interconnect delay fault of the wrapper boundary cell,
an interconnect delay fault test (IDFT) controller generating a control signal for testing the interconnect delay fault of the wrapper boundary cell,
wherein the controller comprises:
a logic unit that generates the control signal comprising an update signal and a capture signal to carry out an update and a capture based on a core clock signal within one interval of the core clock signal in the wrapper boundary cell by receiving a data register shift signal, a data register update signal and a data register capture signal,
wherein the logic unit comprises:
a first AND logic for carrying out an AND operation of a core IDFT control mode signal indicating a normal mode or an IDFT mode and an inverted data register shift signal;
a second AND logic for carrying out an AND operation of the core IDFT control mode signal and the data register update signal;
a third AND logic for carrying out an AND operation of the core IDFT control mode signal and the core clock signal;
a first flip-flop for carrying out a flip-flop operation of an output signal of the second AND logic using an output signal of the third AND logic as a clock signal to output an IDFT_UpDR signal;
a second flip-flop for carrying out a flip-flop operation of an output signal of the first flip-flop using an output signal of the third AND logic as the clock signal to output an IDFT CapDR signal;
a first multiplexer for multiplexing the data register update signal and the IDFT_UpDR signal based on the core IDFT control mode signal to output the update signal; and
a second multiplexer for multiplexing the data register clock signal and the IDFT_CapDR signal based on an output signal of first AND logic to output the capture signal.

* * * * *